(12) United States Patent
Costello et al.

(10) Patent No.: US 7,226,305 B1
(45) Date of Patent: Jun. 5, 2007

(54) LOW INSERTION FORCE SOCKET

(75) Inventors: Brian P Costello, Scotts Valley, CA (US); George R Defibaugh, Harrisburg, PA (US); Richard E Hamner, Hummelstown, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 11/302,932

(22) Filed: Dec. 14, 2005

(51) Int. Cl.
*H01R 13/625* (2006.01)

(52) U.S. Cl. .................................... 439/342

(58) Field of Classification Search ............. 439/342, 439/259, 264, 525, 526
See application file for complete search history.

(56) References Cited

U.S. PATENT DOCUMENTS

| | | | | |
|---|---|---|---|---|
| 5,013,256 A | 5/1991 | Matsuoka et al. | .......... | 439/264 |
| 5,123,855 A | 6/1992 | Petersen | ...................... | 439/263 |
| 6,217,361 B1 | 4/2001 | Murr | ........................... | 439/342 |
| 6,347,951 B1 | 2/2002 | Murr | ........................... | 439/342 |
| 6,350,142 B1 | 2/2002 | Shirai et al. | ............... | 439/342 |
| 6,450,824 B1 * | 9/2002 | Lemke et al. | ............... | 439/342 |
| 6,809,537 B2 * | 10/2004 | Adams | ........................ | 324/755 |
| 7,021,954 B2 * | 4/2006 | Gattuso et al. | ............. | 439/342 |

\* cited by examiner

*Primary Examiner*—Tho D. Ta
*Assistant Examiner*—Vanessa Girardi

(57) ABSTRACT

A socket assembly is shown as generally including a cover assembly and a base frame assembly. A low insertion force (LIF) package assembly is connectable to the socket assembly and is comprised of a pin assembly, housing a package. The cover assembly includes a socket cover frame array and the base frame assembly includes a socket contact frame array. The cover assembly is spring loadable relative to the base frame assembly to provide a low insertion force application for the package.

17 Claims, 17 Drawing Sheets

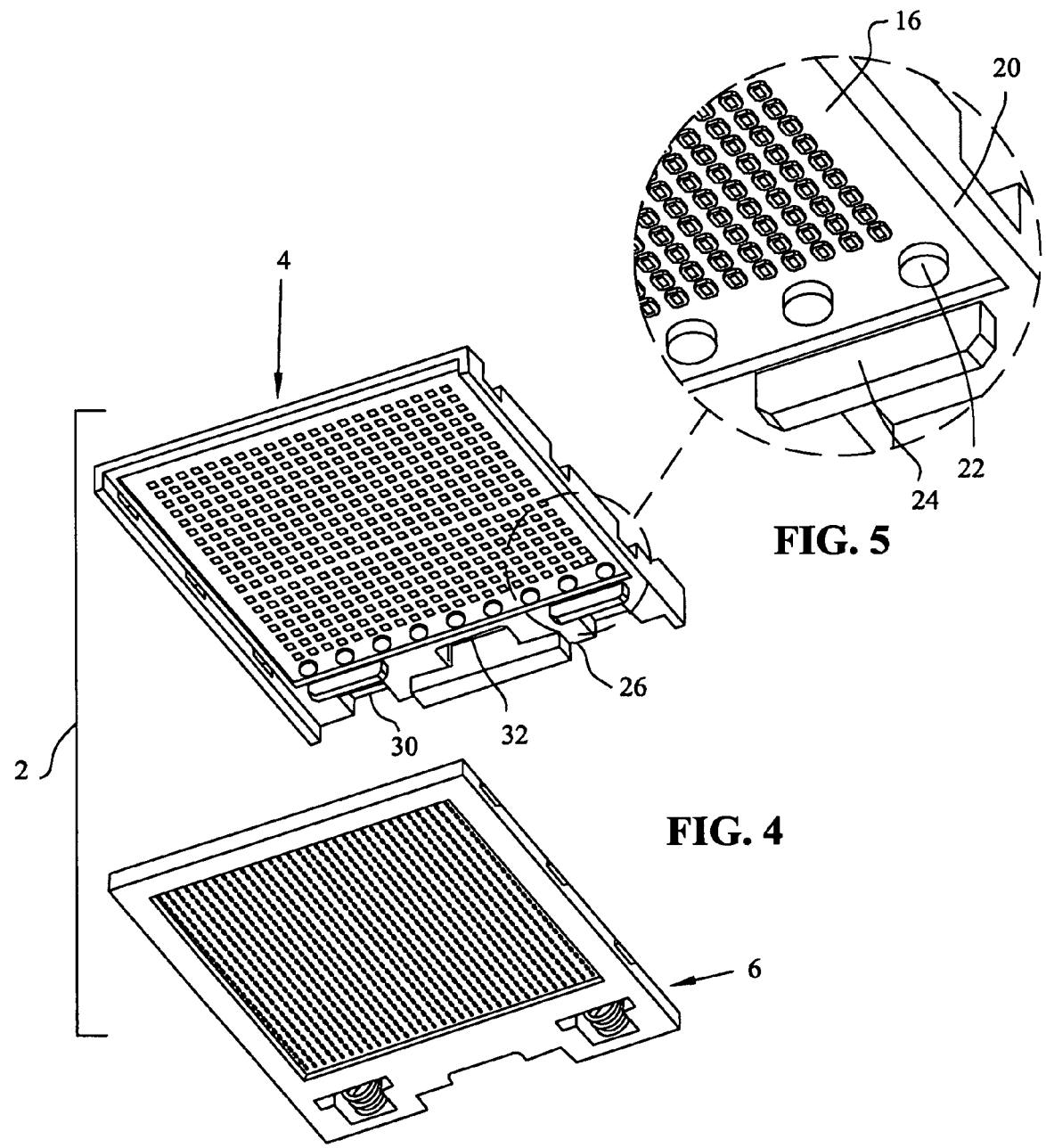

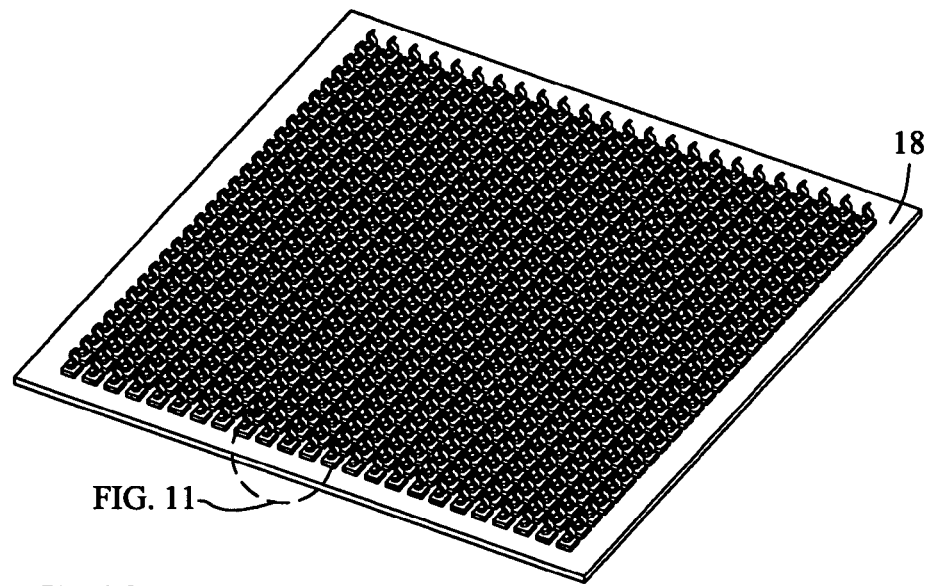
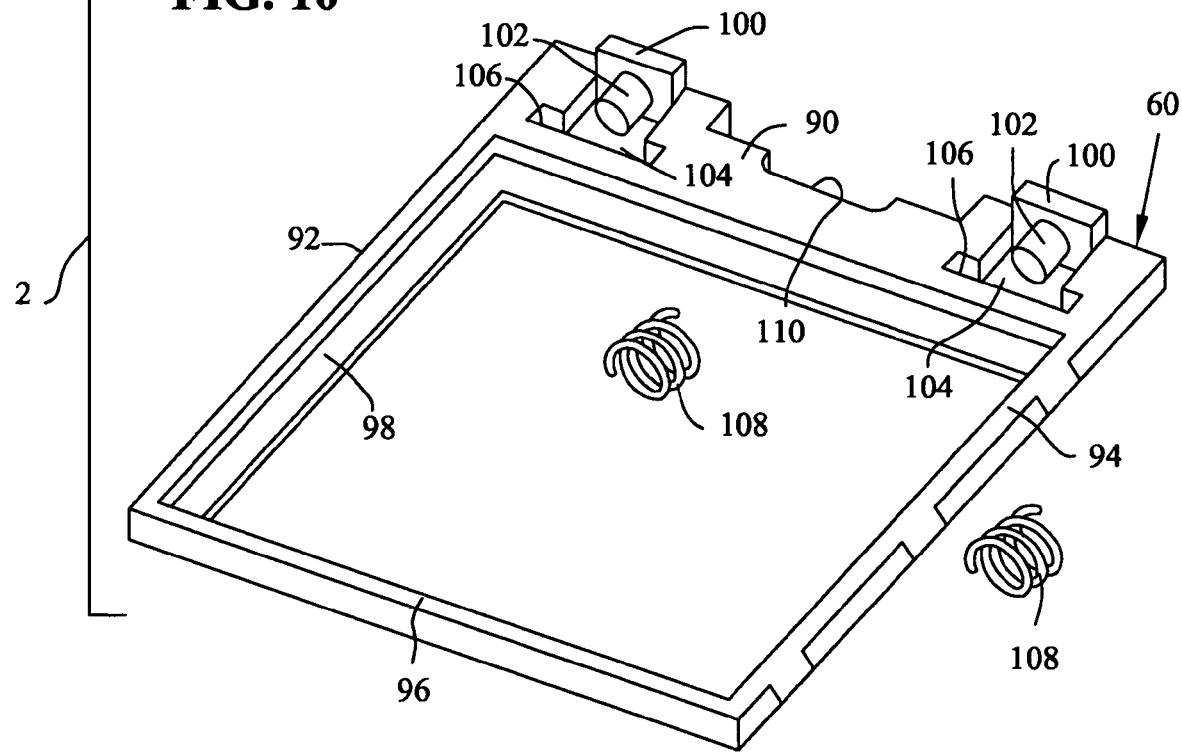
FIG. 10

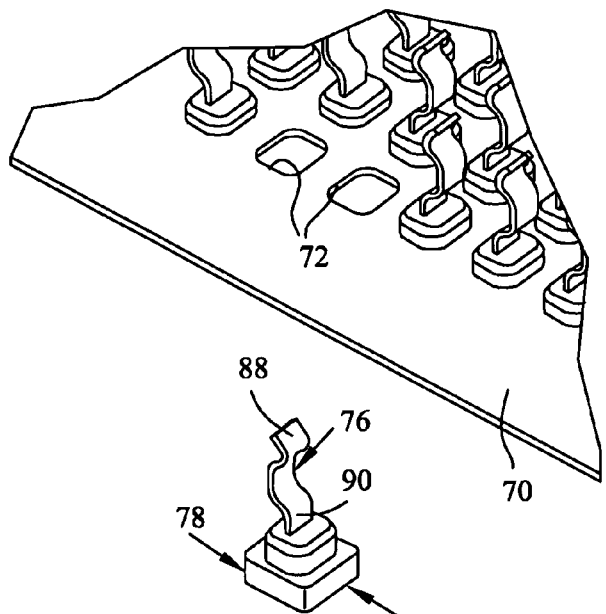
FIG. 11
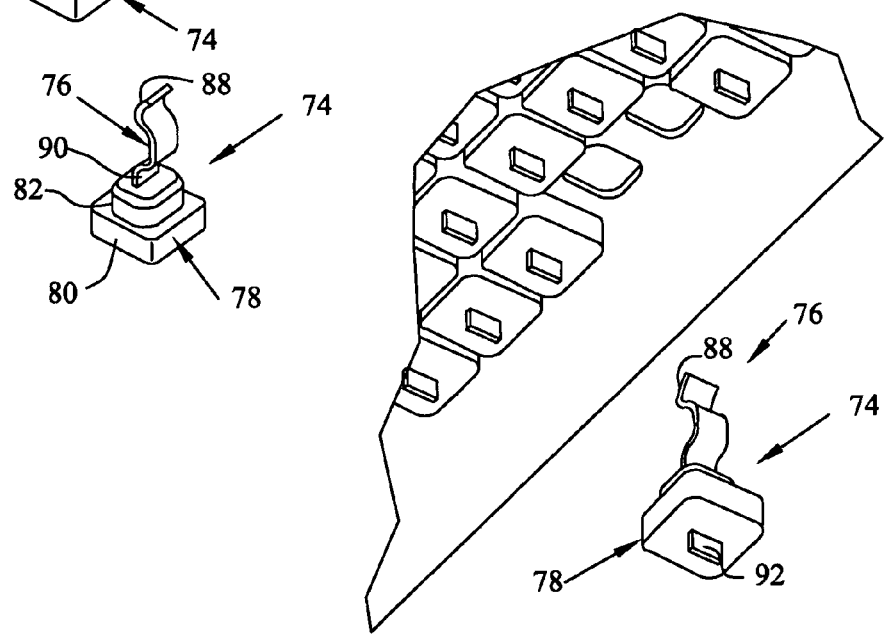
FIG. 12
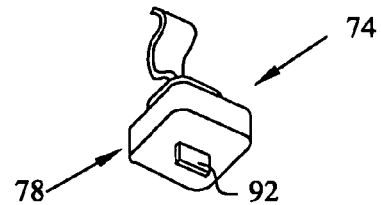

LOW INSERTION FORCE SOCKET

FIELD OF THE INVENTION

The preferred embodiments of the present invention generally relate to electrical sockets, such as sockets for receiving chip packages. More specifically, the preferred embodiments of the present invention generally relate to low insertion force (LIF)/zero extraction force processor package sockets.

BACKGROUND OF THE INVENTION

Heretofore, sockets have been proposed that include a base having a cover slidably mounted thereon. The sliding motion between the base and cover is controlled in numerous manners in conventional zero insertion force (ZIF) or low insertion force (LIF) sockets. For example, U.S. Pat. No. 5,256,080 discloses a bail actuated ZIF socket. U.S. Pat. No. 5,730,615 describes a ZIF PGA socket that uses a flat or plate tool that is inserted into receiving slots in the cover and base. The flat tool is moved between two positions in order to open and close the ZIF socket. U.S. Pat. No. 4,498,725 discloses a prior art PGA socket having a base housing and a moveable cover. An L-shaped lever moves the cover across a top surface of the housing. The lever includes a first arm that is rotatably received in a passage in the socket and a second arm that provides a handle for rotating the first arm.

However, existing sockets have experienced limited applicability to certain processor designs. For instance, many circuit designs are conditioned on PGA chips being arranged in a closely packed manner with respect to one another. At least one conventional socket uses an actuation lever located along one side of the socket and moved in the same direction as the direction of relative movement between the cover and base housing. The lever is moved forward along the side of the socket to drive the cover forward and vice versa. However, as components decrease in size and are located closer to one another, space constraints no longer permit the lever to be located along the side of the socket. Thus, it is desirable to minimize the width of sockets holding the PGA chips.

Also, as chip technology evolves, the number of pins on a single chip increases. The socket achieves a separate electrical contact with each pin on a chip and thus the number of electrical contacts to be maintained by a socket is increased. As the pin/contact count increases, the force required to electrically engage the chip and socket similarly increases. Conventional sockets focus significant actuation forces on small areas on the cover and housing. As the actuation forces increase, various socket designs experience more faults as the housing and cover are unable to withstand the increased loads.

Conventional sockets for high pin count PGA chips generally fall into two categories: Low Insertion Force (and extraction force) also known as LIF, and Zero Insertion Force (and extraction force) also known as ZIF. Due to the high forces of LIF sockets, a tool such as an arbor press is needed to insert the package into the socket and another tool is needed to pull the package from the socket. Insertion is relatively simple since typical chips are able to withstand large forces in compression. Extraction is much more difficult since the package can only be held around the perimeter of the pin field. This can lead to damage to the package due to warping and bending of the package during extraction. This difficulty helped lead to the development of ZIF sockets. ZIF sockets typically employ features such as a sliding cover that actuate and de-actuate the socket. The cover of such sockets must be able to withstand the forces of both actuation and de-actuation. In order to support these forces on both tension and compression, ZIF socket covers need to be thicker. This is a problem since higher speed electrical signals require the socket to be shorter, not taller.

Other socket designs are shown in U.S. Pat. Nos. 5,013,256; 5,123,855; 6,217,361; 6,350,142; and 6,347,951, the disclosures of which are incorporated herein by reference. All of these references show LIF or ZIF style sockets for receiving various style packages. One of the difficulties that exists is that when the packages have high volume arrays, on the order of 1000 positions or more, the typical ZIF or LIF style connectors cannot be used. Multiple design issues compound to cause difficulty in this design, including the tolerances of molding of the housing parts which receive the packages, together with the tolerances of the stamping of the contacts and their alignment in the housing. Thus, with 1000 contacts, even with small frictional insertion forces per contact, the overall extraction or actuation/de-actuation force for the package is unacceptable.

A need remains for an improved socket. It is an object of the preferred embodiments of the present invention to meet this and other needs that will become apparent from the following description, drawings and claims.

SUMMARY OF THE INVENTION

The disclosure provides for a socket for interconnection with a package having an array of contact points. The socket comprises a cover assembly having a housing and a substrate, the cover assembly substrate has apertures aligned in a like array as the package, the substrate having a plurality of pin guides positioned therein. A base frame assembly has a frame and a substrate, the base frame assembly substrate has a plurality of socket contact assemblies positioned therein, and the socket contact assemblies are positioned in an overlapping manner with the pin guides. The cover assembly is laterally movable relative to the base frame assembly, from a position where the pin guides overlap the socket contact assemblies, to a position where the pin guides are spaced from the socket contact assemblies.

In another embodiment, a socket is provided for interconnection with a package having an array of contact points. A cover assembly has a housing and a substrate, the cover assembly substrate has apertures aligned in a like array as the package, and the substrate has a plurality of pin guides positioned therein. A base frame assembly has a frame and a substrate, the base frame assembly substrate has a plurality of socket contact assemblies positioned therein, the socket contact assemblies are positioned in an overlapping manner with the pin guides. A pin carrier assembly is provided for receiving and interconnecting the package to the socket, the pin carrier assembly includes a substrate holding a plurality of pins, the pins including an upper contact portion positioned above the substrate, and a pin contact positioned below the substrate.

BRIEF DESCRIPTION OF THE DRAWINGS

FIG. 4 shows an underside perspective of the exploded view of FIG. 3;

FIG. 5 shows an enlarged view of the portion denoted in FIG. 4;

FIG. 10 shows an exploded view of the base frame assembly of FIG. 3;

FIG. 11 shows an enlarged view of the portion of FIG. 10 with two of the socket contacts removed;

FIG. 12 is an underside perspective of the socket contact frame assembly of FIG. 11;

DETAILED DESCRIPTION OF INVENTION

Figure 1:
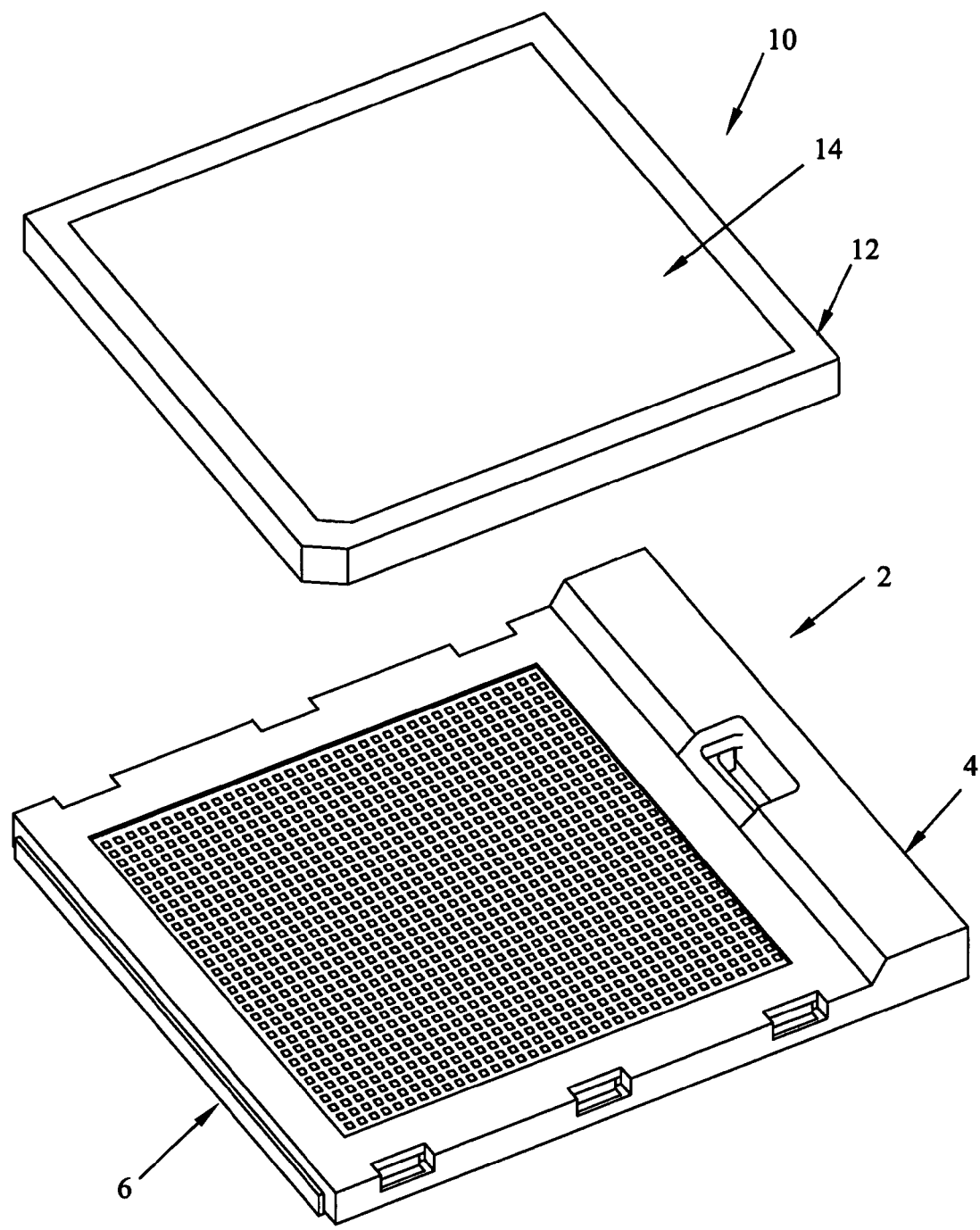
FIG. 1 depicts a low insertion force, zero extraction force socket assembly shown with a package assembly poised above the socket.
Figure 2:
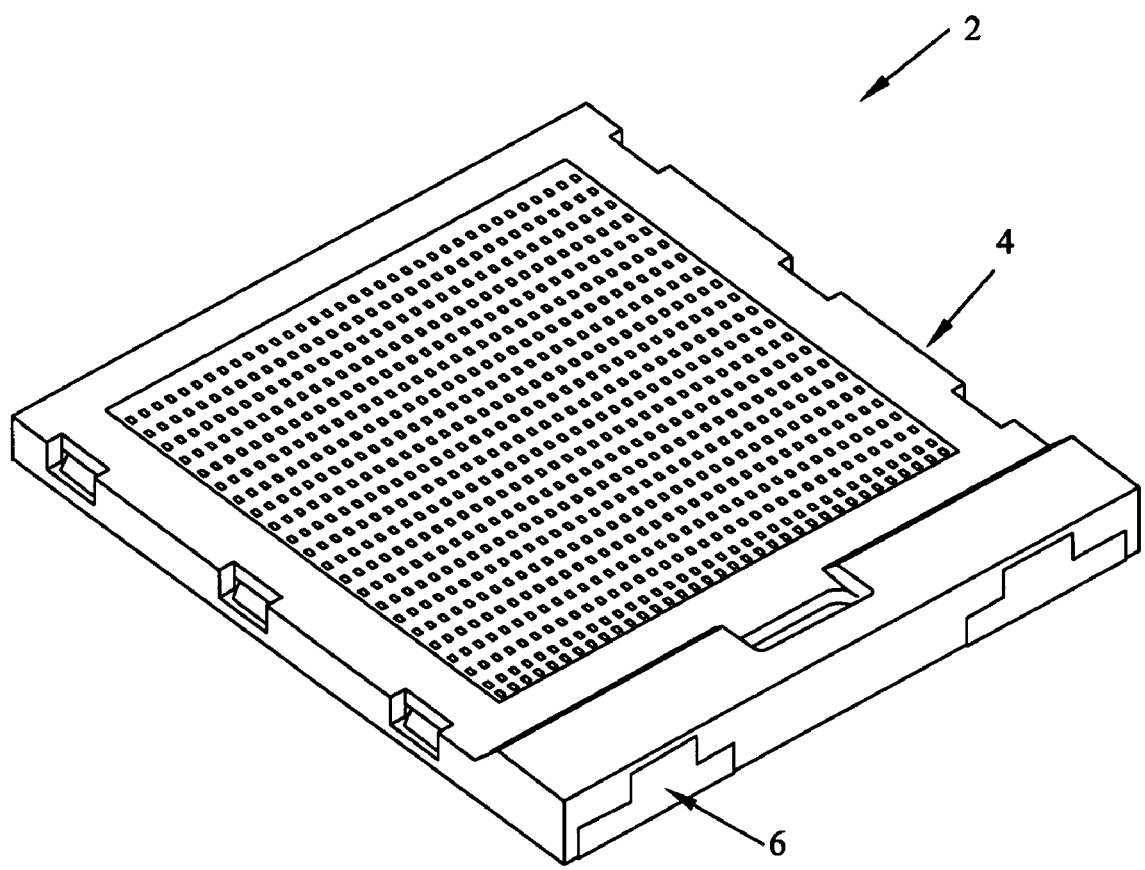
FIG. 2 shows another perspective of the socket assembly of FIG. 1.
Figure 3:
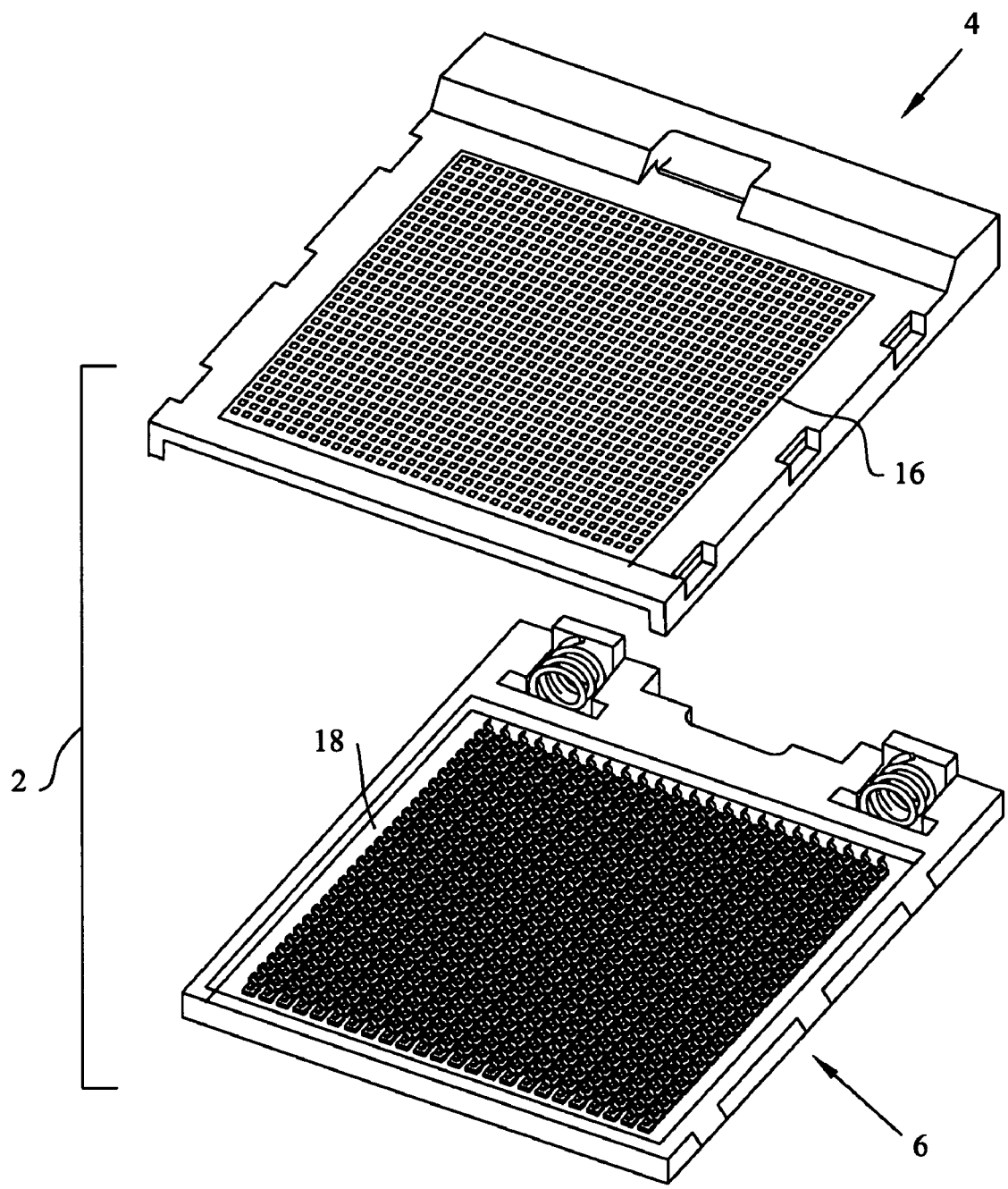
FIG. 3 shows a partially exploded view with the cover assembly exploded away from the socket base frame assembly.

With respect first to FIGS. 1 and 2, the socket assembly is shown generally at 2 and includes a cover assembly 4 and a base frame assembly 6. FIG. 1 also shows a low insertion force (LIF) package assembly 10 comprised of a pin assembly 12, housing a package 14. With respect to FIG. 3, the socket assembly 2 is shown in an exploded manner, showing the cover assembly 4 poised above the base frame assembly 6. As shown in FIG. 3, cover assembly 4 includes a socket cover frame array 16 while the base frame assembly 6 includes a socket contact frame array 18.

Figure 6:
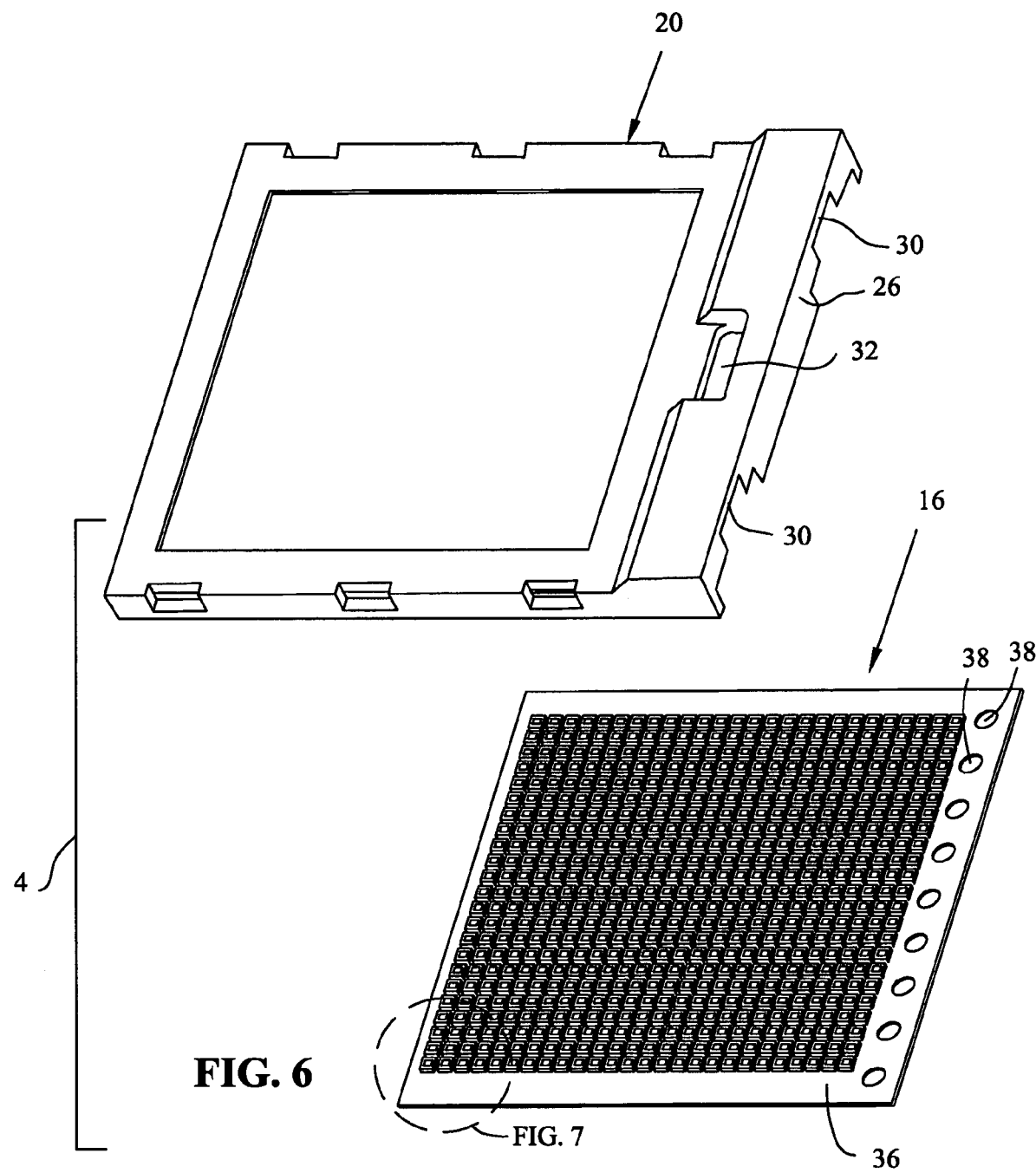
FIG. 6 shows an exploded view of the cover assembly of FIG. 3.

With respect now to FIGS. 4, 5 and 6, the cover assembly 4 will be described in greater detail. As shown in FIGS. 4 and 5, cover assembly 4 shows the socket cover frame array 16 attached to a bottom of a cover frame 20. As best shown in FIG. 5, socket cover frame array 16 is shown attached to cover frame 20 by way of heat stake lugs 22 which both locates the socket cover frame array and retains the socket cover frame array relative to the cover frame 20. It should be understood that cover frame array 16 can be attached to cover frame 20 in any known manner. As also shown in FIG. 5, cover frame 20 includes a spring thrust plate 24 positioned on either side of a rear wall 26 which opens onto a rear opening 30. As also shown in FIG. 6, cover frame 20 includes an actuation slot 32 for actuating the socket assembly as will be described herein.

Figure 7:
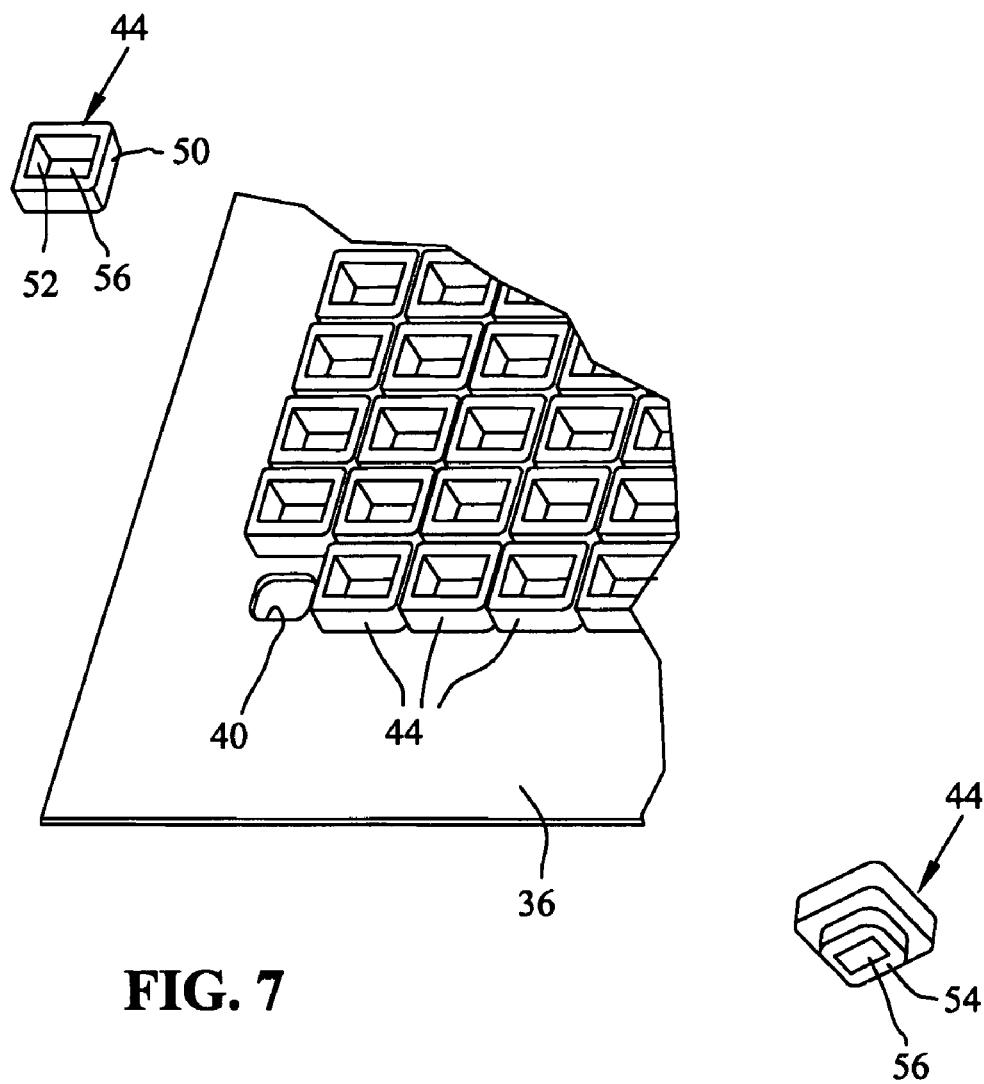
FIG. 7 shows an enlarged view of the area denoted in FIG. 6 with one of the pin guides exploded from the frame.
Figure 8:
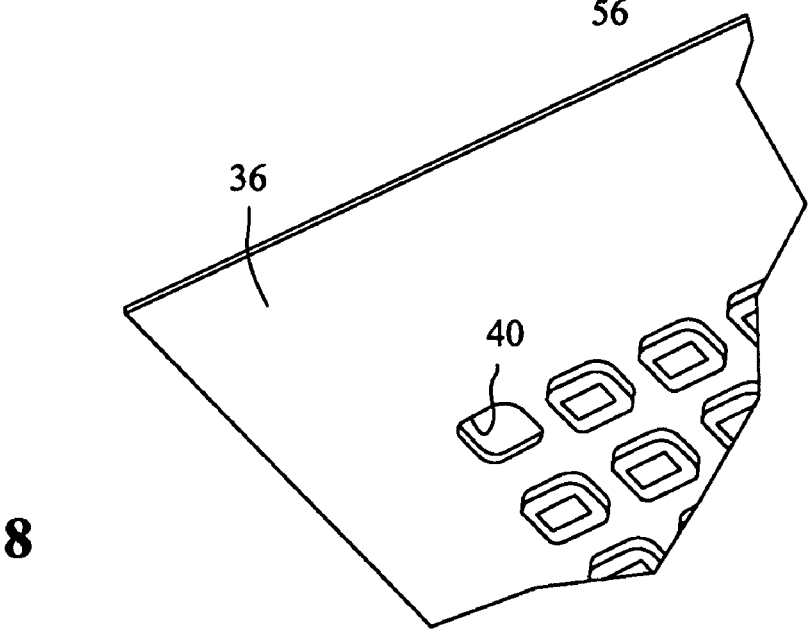
FIG. 8 shows the frame of FIG. 7 from an underside perspective with one of the pin guides exploded from the frame.
Figure 9:
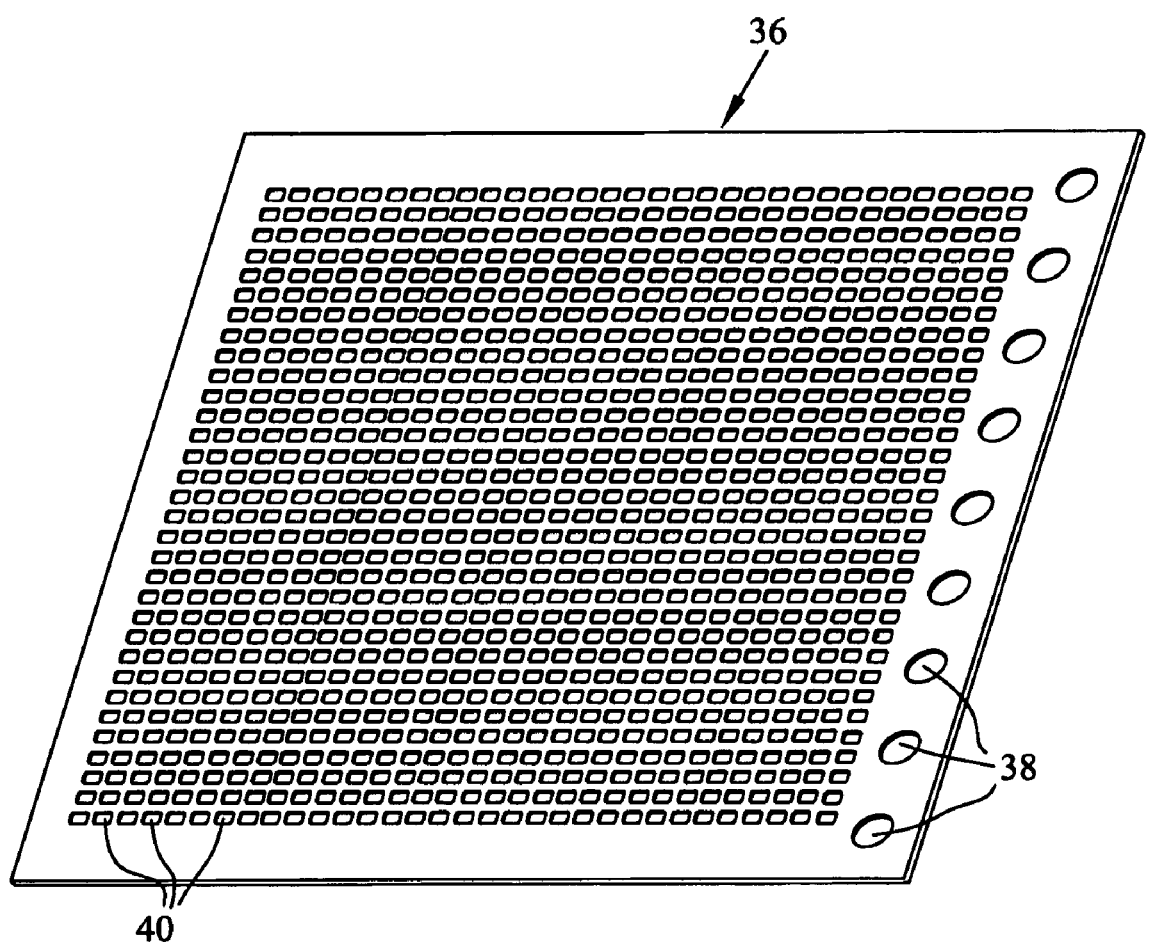
FIG. 9 shows the frame of FIG. 6 with all of the pin guides removed.
Figure 13:
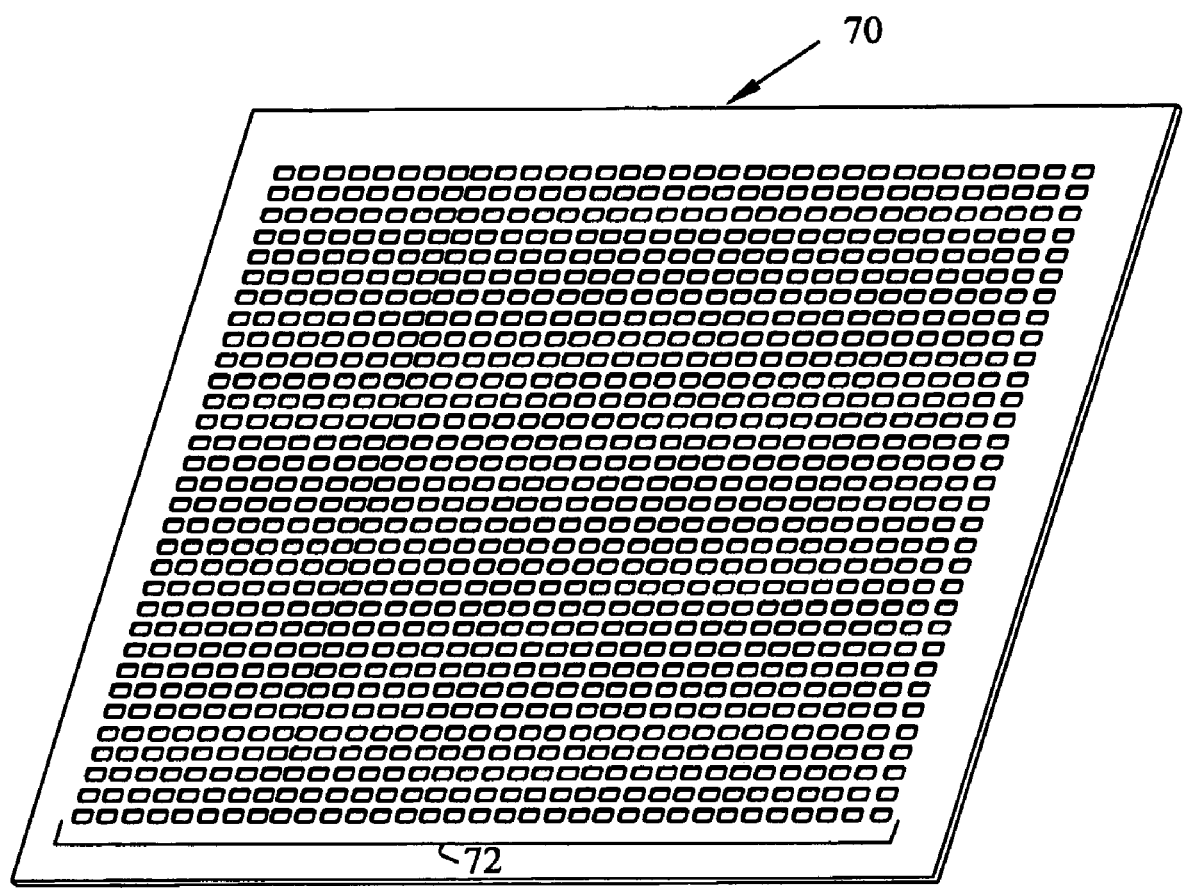
FIG. 13 shows the etched frame of FIGS. 10–12 with all of the socket contacts removed.
Figure 14:
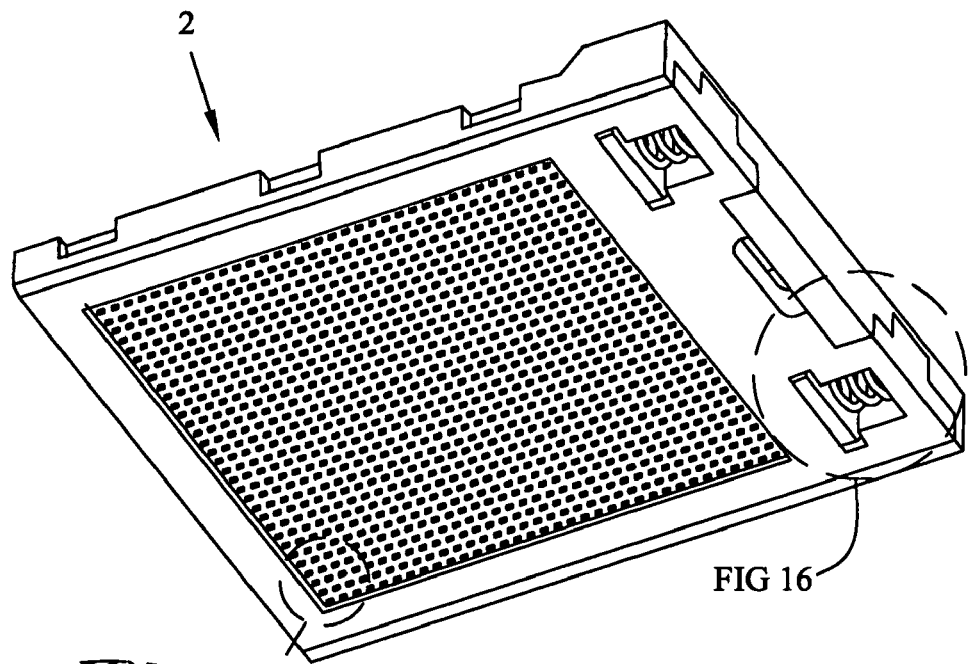
FIG. 14 shows an underside perspective view of the socket assembly as assembled.
Figure 15:
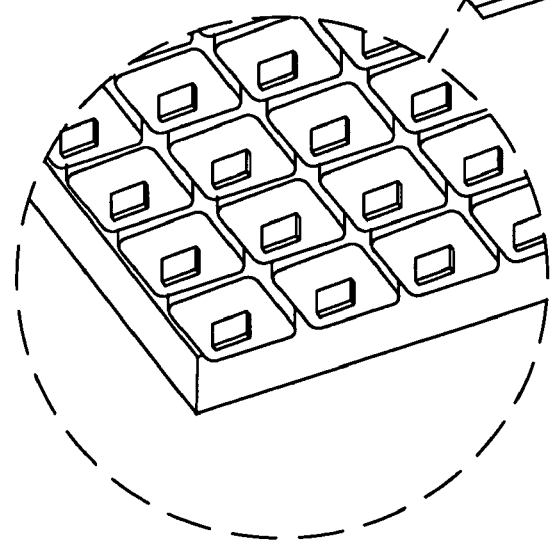
FIG. 15 shows an enlarged view of the portion denoted in FIG. 14.
Figure 16:
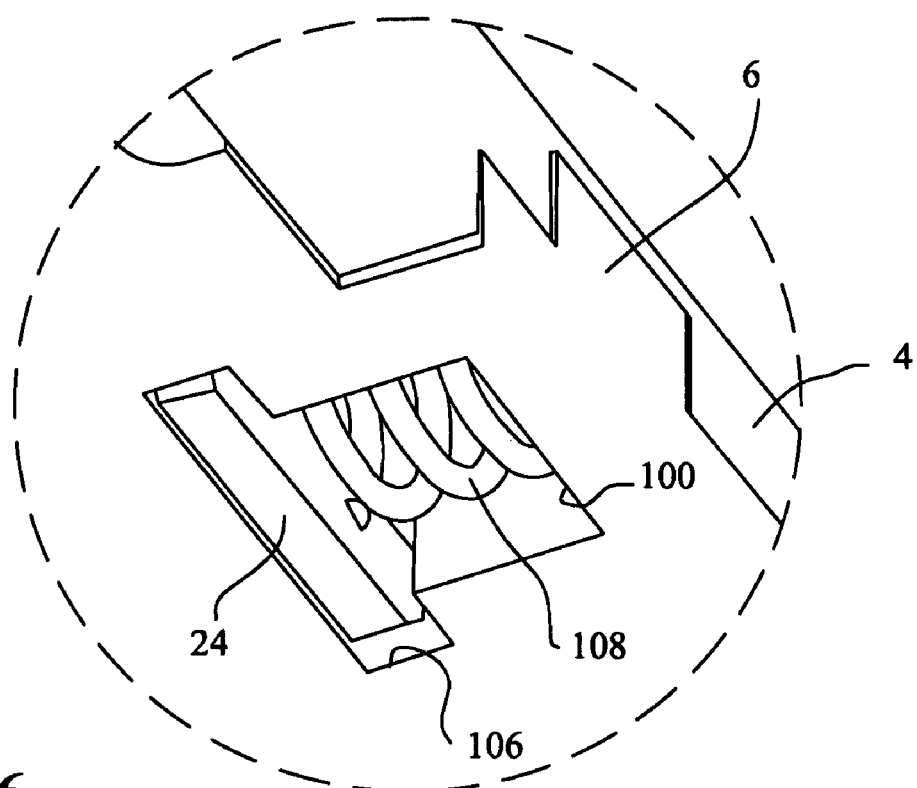
FIG. 16 shows an enlarged view of the portion denoted in FIG. 14.

As shown in FIGS. 7, 8 and 9, socket cover frame array 16 is comprised of a substrate 36 having at one edge thereof openings 38, which receive the heat stake lugs 22 described above, and further include a plurality of apertures 40 which receive insulator pin guides 44. Substrate 36 is comprised of a material to thermally match with the device connected. The substrate could be a metallic plate, a copper alloy or a stainless steel plate. FIG. 9 shows the substrate 36 with all of the insulator pin guides 44 removed, and shows an array of apertures 40. Preferably, the array of openings 40 is provided in a precise alignment. An etching process can be used to precisely align and form the array of apertures 40. As shown in FIGS. 7 and 8, the insulator pin guides 44 include an upper head section 50 having a lead in section 52 and a lower section 54 profiled for receipt through one of the apertures 40. Openings 56 are defined through the pin guides extending through the entirety thereof, from the lead in section, through the lower section 54.

It should be appreciated that insulator pin guides 44 could be molded to the apertures 40, could be rubber type grommets received through the apertures 40 or could be insulative plastic positioned in the openings and then crimped or otherwise deformed to be retained in the apertures 40. With respect to the latter crimping step, applicants refer to, and incorporate by reference, U.S. Pat. No. 6,945,788.

With respect now to FIG. 10, the base frame assembly 6 is shown as comprised of the socket contact frame array 18 and a base frame housing 60. As best shown in FIGS. 11 and 12, socket contact frame array 18 is comprised of a plate or substrate 70 having a plurality of apertures 72 which align and retain a plurality of socket contact assemblies 74. The material composition of substrate 70 and the considerations are similar to that described above with respect to substrate 36. Socket contact assemblies 74 are comprised of contacts 76 and over molded insulators 78. As shown in both FIGS. 11 and 12, molded insulator 78 are rectangular in configuration having a large base portion 80 and a reduced cross section portion 82. Meanwhile contact portions 76 include a contact surface 88 extending from a central molded in section 90 and a contact portion 92 (FIG. 12) protruding from the opposite side of molded insulator 78. Once again, the over molded insulators 78 can be attached to the substrate 70 as described in U.S. Pat. No. 6,945,788.

With respect again to FIG. 10, base frame housing 60 is shown with a rear wall portion 90 having side wall portions 92, 94 and end wall portion 96. As shown, walls 90–96 define a frame work with a reduced shoulder at 98. It should be appreciated that the shoulder 98 is defined to receive the socket contact frame array 18. As also shown, rear wall portion 90 includes upstanding wall sections 100 having a spring locator peg 102 extending integrally there from. Pegs 102 extend into T-shaped openings 104 having slots 106. Springs may be received in T-shaped openings 104 over pegs 102 as described below. Finally rear wall portion 90 includes a bearing surface at 110 which communicates with actuator slot 32 described below.

With respect now to FIGS. 10, and 14–16, the assembly of socket assembly 2 will be described. It should be appreciated that socket contact frame array 18 is positioned within the base frame housing 60 along the shoulder 98. Springs 108 are thereafter positioned over pegs 102 and cover assembly 4 is then positioned over base frame assembly 6. As shown best in FIGS. 14 and 16, thrust plates 24 extending from cover frame 20 (FIG. 5) are positioned within T-shaped slots 106 with springs 108 positioned there between. It should be understood that the width of the slots 106 is greater than the thickness of the thrust plates 24, in order that the springs 108 can provide relative movement between the cover assembly 4 and base frame assembly as described below.

Spring 108 is a compression spring and is compressed between the cover assembly 4 and the base spring assembly 6. That is, spring 108 is compressed against thrust plate 24 of the cover assembly 4 and is compressed against upstanding wall section 100 of the base frame housing 60. When in this position, the openings 56 (FIG. 7, 8) are spring loaded into an overlapping position with the contact portions 88 (FIG. 12) as will be described herein.

Figures 17, 18:
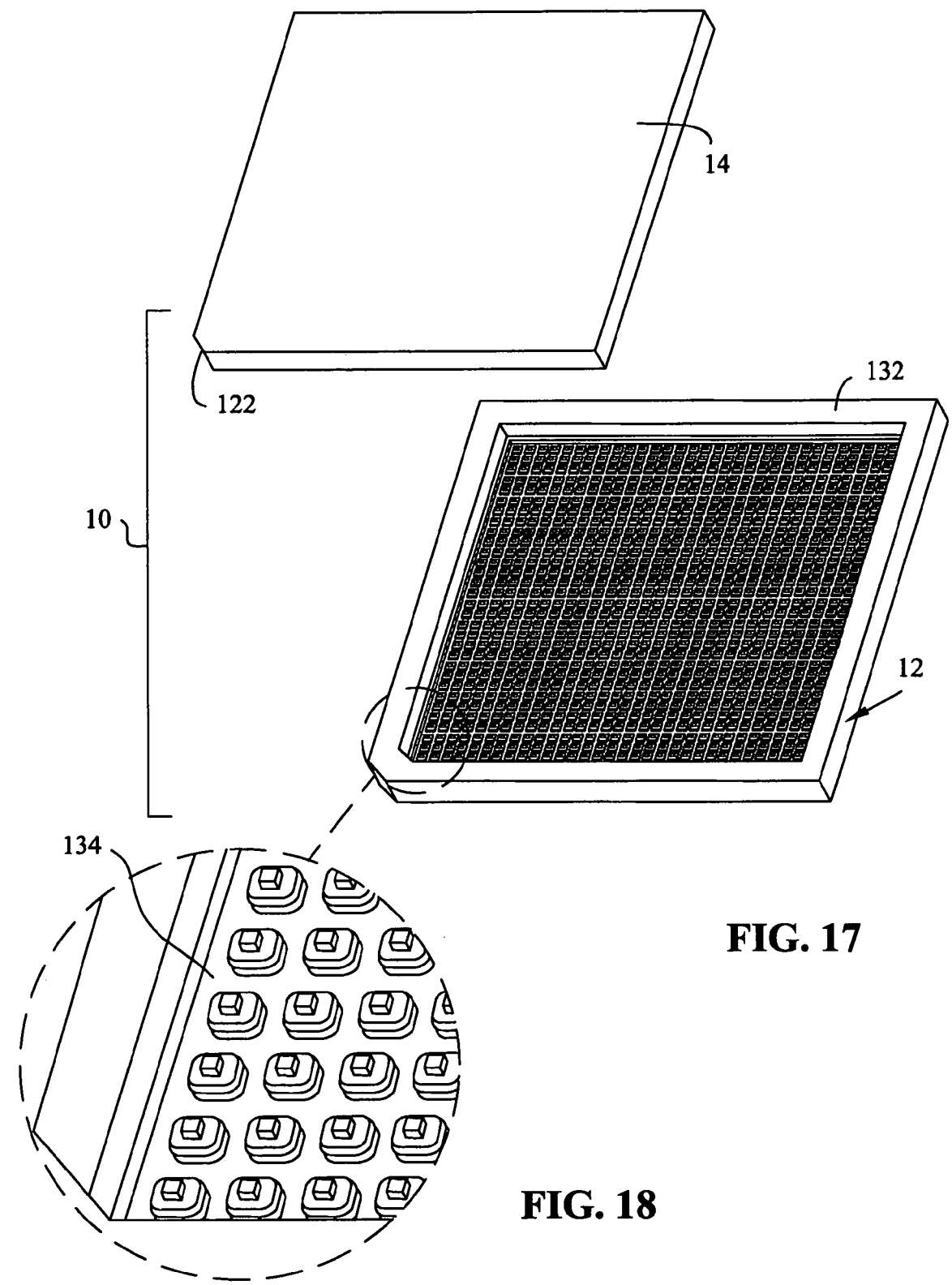
FIG. 17 shows the package assembly of FIG. 1 with the package exploded away.
FIG. 18 shows an enlarged view of the portion denoted in FIG. 17.
Figure 19:
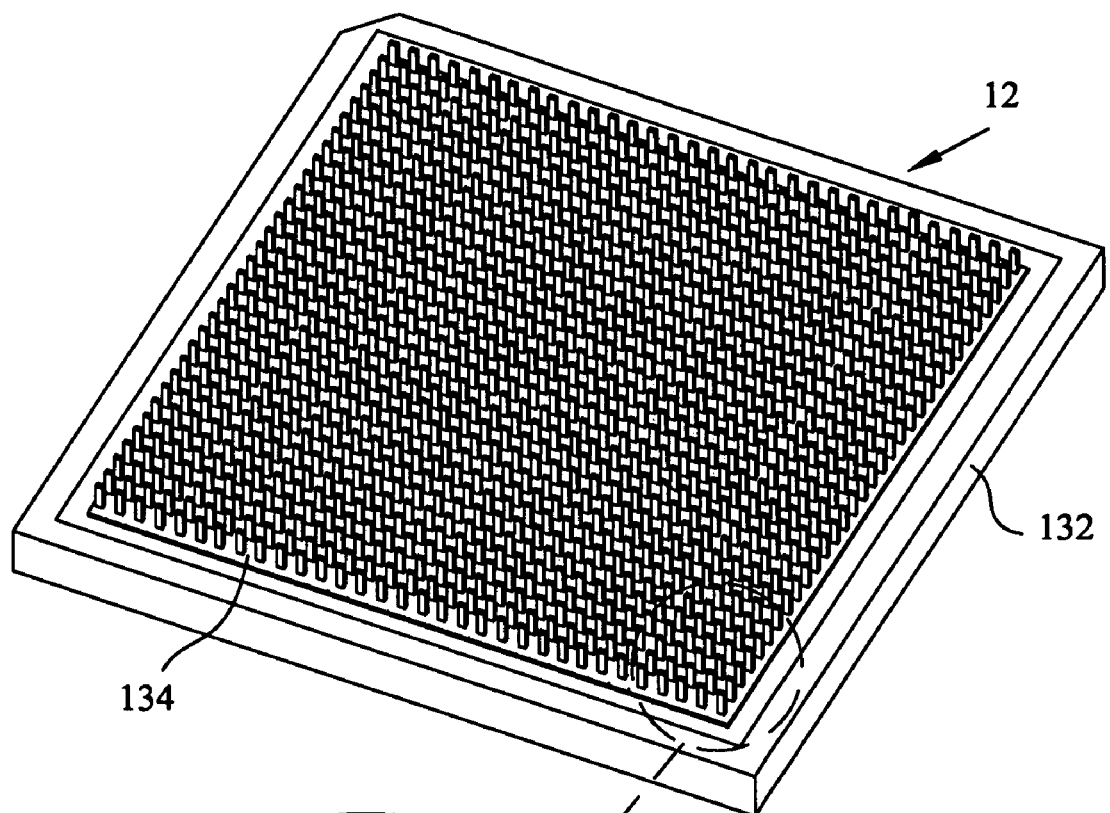
FIG. 19 shows an underside perspective of the package assembly of FIG. 17.
Figure 20:
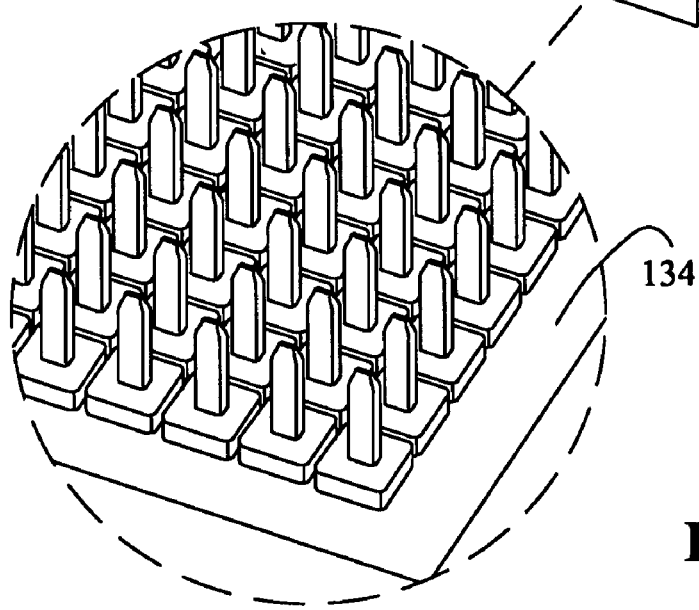
FIG. 20 shows an enlarged view of the portion denoted in FIG. 19.
Figure 21:
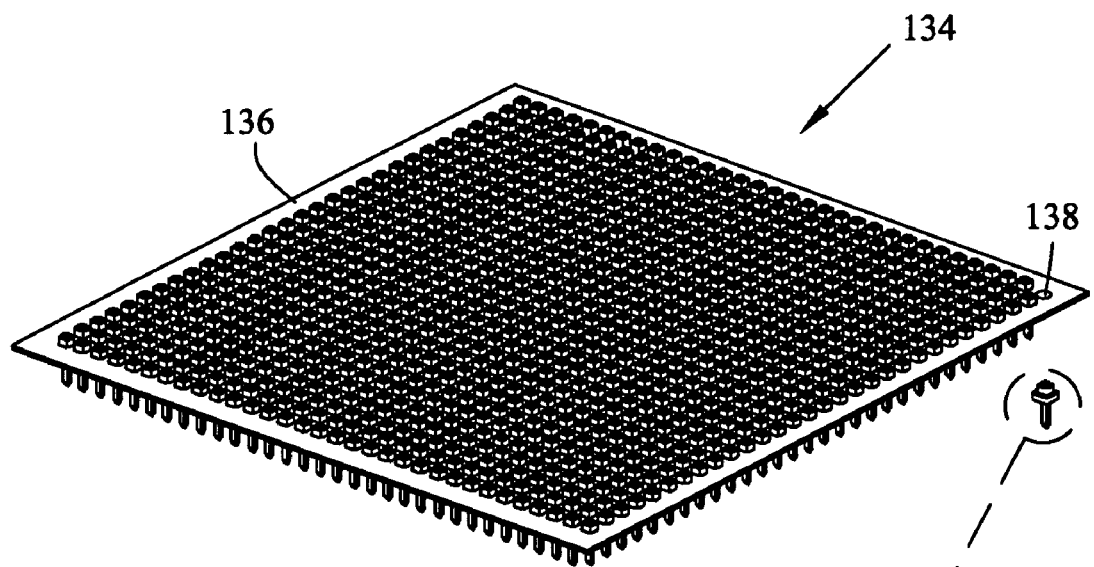
FIG. 21 shows the pin frame assembly removed from the package assembly of either FIG. 17 or 19 with one of the pins removed from the frame.
Figure 22:
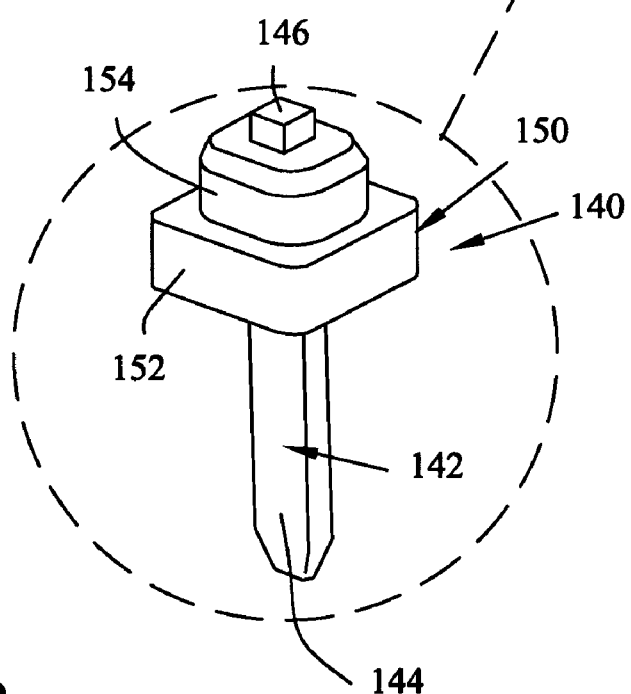
FIG. 22 is an enlarged view of the exploded pin of FIG. 21.

With respect now to FIGS. 17 and 18, the LIF package assembly 10 will be described in greater detail. As shown in FIG. 17, the LIF package assembly 10 is comprised of a package 14, such as ASIC package having a polarizing corner at 122. The ASIC package 14 will be profiled to be received in a pin assembly 12, where pin assembly 12 includes a package frame housing 132 and a pin frame assembly 134. As shown in FIGS. 21 and 22, pin frame assembly 134 is shown comprising a plate or substrate 136 having a plurality of apertures such as 138, through which pin assemblies 140 are positioned. The material composition of substrate 136 and the considerations are similar to that described above with respect to substrate 36. Pin assemblies 140 are comprised of pins 142 having elongate contact portions 144 and upper contact surfaces 146. Assemblies 140 further include insulators 150 having an enlarged portion 152, and a reduced cross section 154. Insulators 150 are positioned within apertures 138 and attached thereto in a similar way as described above with respect to either insulator pin guides 44 or insulators 78. As configured, pin frame assembly 134 is positioned within frame housing 132, with contact surfaces 146 poised for receipt of package 120 as best shown in FIGS. 17 and 18. An alternate embodiment of the integrated circuit package that mates to the socket is for pins, similar to 144 but without the plastic insulator, to be directly attached to the integrated circuit package.

Figure 23:
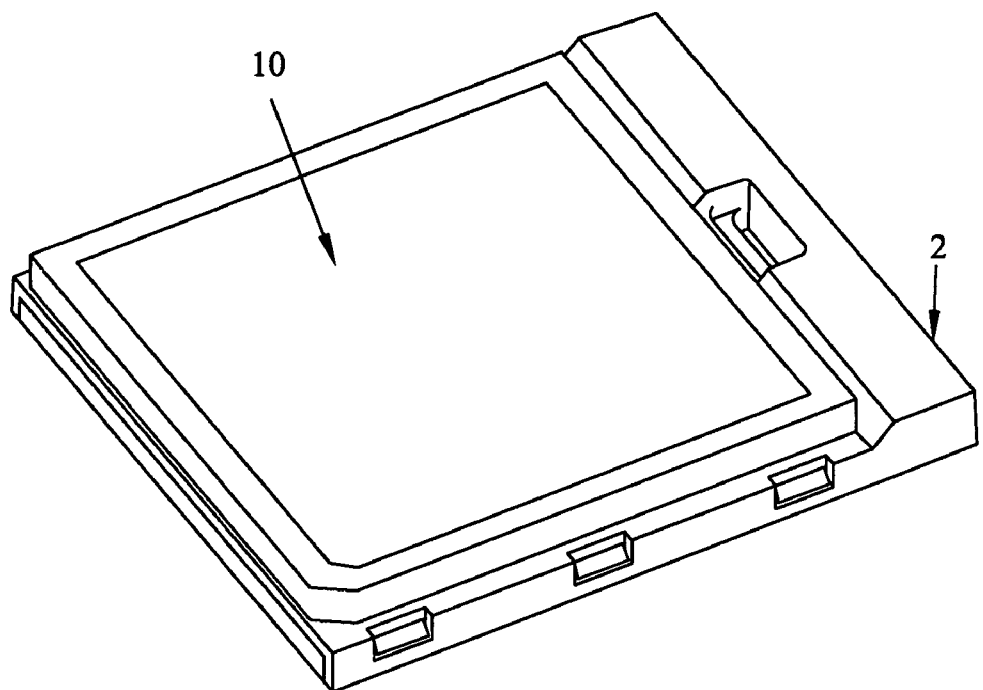
FIG. 23 shows a perspective view similar to that of FIG. 1 with the package assembly fully installed in the socket and shown in the actuated condition.
Figure 24:
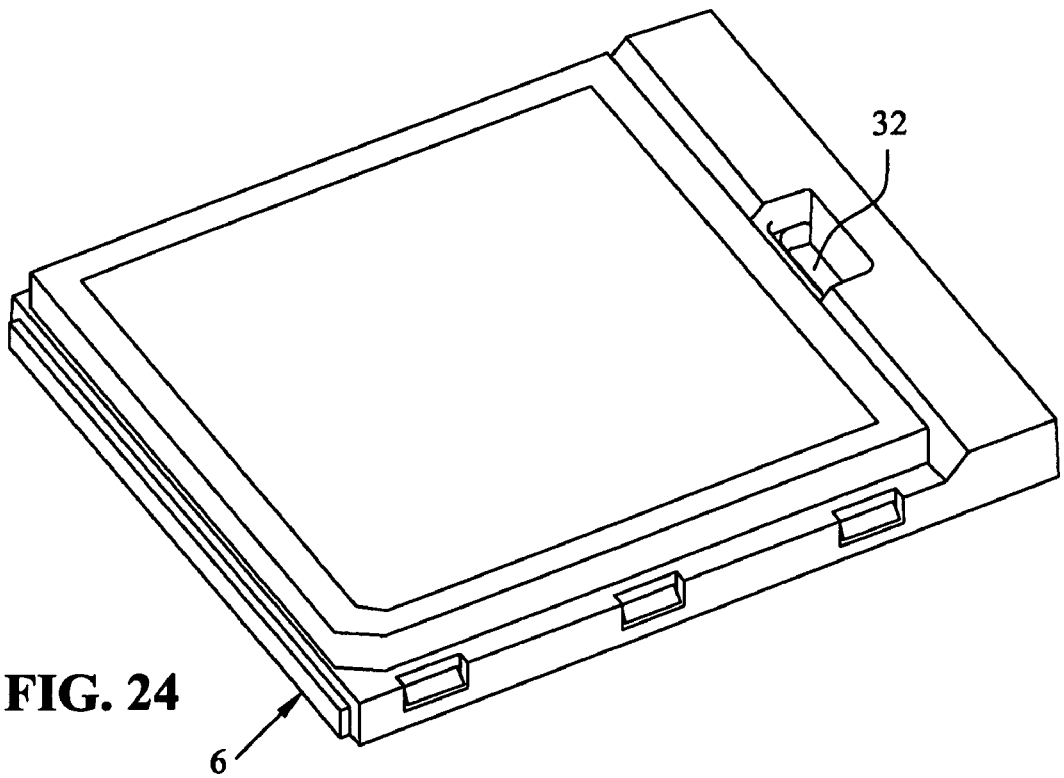
FIG. 24 is a view similar to that of FIG. 23 showing the socket de-actuated.
Figures 25, 26:
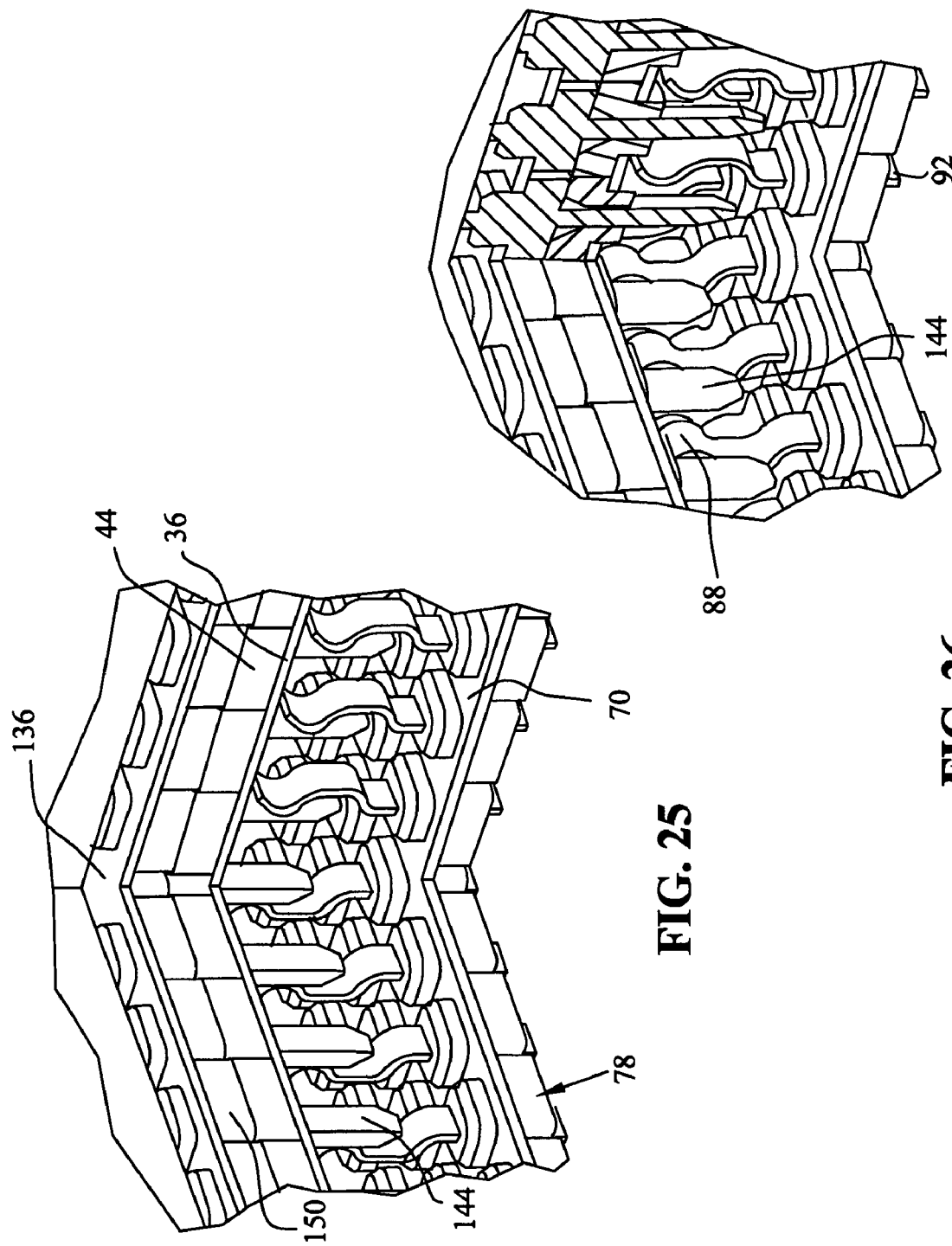
FIG. 25 shows a cross-sectional view through a portion of FIG. 23.
FIG. 26 shows a cross-sectional view through a portion of FIG. 24.

Thus as shown in FIG. 23, package assembly 10 is shown positioned within socket assembly 2 whereby package 10 would be interconnected to contact surfaces 146, and where contact portions 144 would protrude through pin guides 44 and into contact with contact portions 88 (FIG. 12). Thus, as shown in FIG. 23, the package 120 would be interconnected to contacts 76 as described above. This state corresponds to the cross-sectional view of FIG. 25. However when in the de-actuated position of FIG. 24, which can be de-actuated for example with a screw driver blade in de-actuation slot 32, base frame assembly 6 and cover assembly 4 can be moved to a relative position where pins are spaced away from the contact portions, as shown in FIG. 26, and whereby the package assembly 10 can be removed, with zero extraction force.

What is claimed is:

1. A socket for interconnection with a package having an array of contact points, the socket comprising:

a cover assembly having a housing and a substrate, the cover assembly substrate having apertures aligned in a like array as the package, the substrate having a plurality of pin guides positioned in the apertures;

a base frame assembly having a frame and a metallic substrate, the base frame assembly substrate having a plurality of socket contact assemblies positioned therein and insulated from said substrate, the socket contact assemblies positioned in an overlapping manner with said pin guides;

said cover assembly being laterally movable relative to said base frame assembly, from a position where said pin guides overlap said socket contact assemblies, to a position where said pin guides are spaced from said socket contact assemblies.

2. The socket of claim 1, wherein said cover assembly substrate material is thermally matched to the package.

3. The socket of claim 2, wherein said cover assembly substrate is metallic.

4. The socket of claim 1, wherein said pin guides have an enlarged head portion, having a profile larger than the apertures, and a lower portion received through said apertures.

5. The socket of claim 1, wherein said base frame assembly substrate is thermally matched to the package.

6. The socket of claim 5, wherein said socket contact assemblies are comprised of conductive contacts positioned in insulators, the insulators being positioned in apertures of said base frame assembly substrate.

7. The socket of claim 6, wherein said insulators are overmolded over said conductive contacts.

8. The socket of claim 1, further comprising a pin carrier assembly for receiving and interconnecting the package to the socket.

9. The socket of claim 8, wherein the pin carrier assembly includes a substrate holding a plurality of pins, said pins including an upper contact portion positioned above said substrate, and a pin contact positioned below said substrate.

10. The socket of claim 9, wherein said substrate is metallic and said pins are surrounded by an insulating member.

11. The socket of claim 10, wherein said insulating member is an overmolded member which is insertable through apertures of said pin carrier assembly substrate.

12. A socket for interconnection with a package having an array of contact points, the socket comprising:

a cover assembly having a housing and a metallic substrate, the cover assembly substrate having etched apertures aligned in a like array as the package, the substrate having a plurality of insulative pin guides positioned in the apertures;

a base frame assembly having a frame and a substrate, the base frame assembly substrate having a plurality of socket contact assemblies positioned therein, the socket contact assemblies positioned in an overlapping manner with said pin guides; and a pin carrier assembly for receiving and interconnecting the package to the socket, the pin carrier assembly includes a substrate holding a plurality of pins, said pins including an upper contact portion positioned above said substrate, and a pin contact positioned below said substrate.

13. The socket of claim 12, wherein said cover assembly is laterally movable relative to said base frame assembly, from a position where said pin guides overlap said socket contact assemblies, to a position where said pin guides are spaced from said socket contact assemblies.

14. A socket for interconnection with a package having an array of contact points, the socket comprising:
- a cover assembly having a housing and a substrate, the cover assembly substrate having apertures aligned in a like array as the package, the substrate having a plurality of pin guides positioned in the apertures;
- a base frame assembly having a frame and a metallic substrate, the base frame assembly substrate having a plurality of socket contact assemblies comprised of conductive contacts positioned in insulators, the insulators being positioned in apertures of said base frame assembly substrate, the socket contact assemblies positioned in an overlapping manner with said pin guides; and
- a pin carrier assembly for receiving and interconnecting the package to the socket, the pin carrier assembly including a substrate holding a plurality of pins, said pins including an upper contact portion positioned above said substrate, and a pin contact positioned below said substrate.

15. The socket of claim 14, wherein the pin carrier assembly includes a substrate holding a plurality of pins, said pins including an upper contact portion positioned above said substrate, and a pin contact positioned below said substrate.

16. The socket of claim 15, wherein said substrate is metallic and said pins are surrounded by an insulating member.

17. The socket of claim 16, wherein said insulating member is an overmolded member which is insertable through apertures of said pin carrier assembly substrate.

* * * * *